United States Patent
Oppelt et al.

(10) Patent No.: US 10,365,336 B2
(45) Date of Patent: Jul. 30, 2019

(54) CONTINUOUSLY DIGITALLY ADJUSTABLE PHASE ACTUATOR

(71) Applicant: Siemens Healthcare GmbH, Erlangen (DE)

(72) Inventors: Ralph Oppelt, Uttenreuth (DE); Franz Eiermann, Rattelsdorf-Ebing (DE); Klaus Huber, Effeltrich (DE)

(73) Assignee: Siemens Healthcare GmbH, Erlangen (DE)

( * ) Notice: Subject to any disclaimer, the term of this patent is extended or adjusted under 35 U.S.C. 154(b) by 0 days.

(21) Appl. No.: 15/998,589

(22) Filed: Aug. 15, 2018

(65) Prior Publication Data

US 2019/0056467 A1 Feb. 21, 2019

(30) Foreign Application Priority Data

Aug. 15, 2017 (DE) .................. 10 2017 214 180

(51) Int. Cl.
*H03H 11/16* (2006.01)
*G01R 33/36* (2006.01)

(52) U.S. Cl.
CPC ......... *G01R 33/3607* (2013.01); *H03H 11/16* (2013.01)

(58) Field of Classification Search
CPC .................................. G01R 33/3607
USPC ................................ 324/322, 318
See application file for complete search history.

(56) References Cited

U.S. PATENT DOCUMENTS

| 5,260,658 A | 11/1993 | Greim et al. |
| 8,653,873 B2* | 2/2014 | Cook ............ H03K 7/08 326/52 |
| 9,893,707 B2* | 2/2018 | Cook ............ H03H 7/20 |
| 9,952,297 B2* | 4/2018 | Wang ............ G01R 33/34092 |
| 2009/0076378 A1 | 3/2009 | Misic |
| 2015/0244054 A1 | 8/2015 | Oppelt |
| 2018/0210046 A1* | 7/2018 | Xu ............ G01R 33/34076 |

FOREIGN PATENT DOCUMENTS

DE 102014203228 A1 8/2015

OTHER PUBLICATIONS

German Office Action for German Application No. 102017214180.8, dated Feb. 27, 2018, with English Translation.

* cited by examiner

*Primary Examiner* — Louis M Arana
(74) *Attorney, Agent, or Firm* — Lempia Summerfield Katz LLC

(57) ABSTRACT

A phase actuator for a continuously adjustable phase displacement at a first frequency is provided. The phase actuator has a first inductance with tapping point, a first continuously variable capacitor, and a transformation network. A signal input and a signal output of the phase shifter are connected by the first inductance. The first continuously adjustable capacitor is connected in parallel to the first inductance. The tapping point is connected via a transformation network to a reference mass, where an impedance value of the transformation network corresponds to a quarter wave transform of a capacitance value of the first continuously variable capacitance at the first frequency.

16 Claims, 2 Drawing Sheets

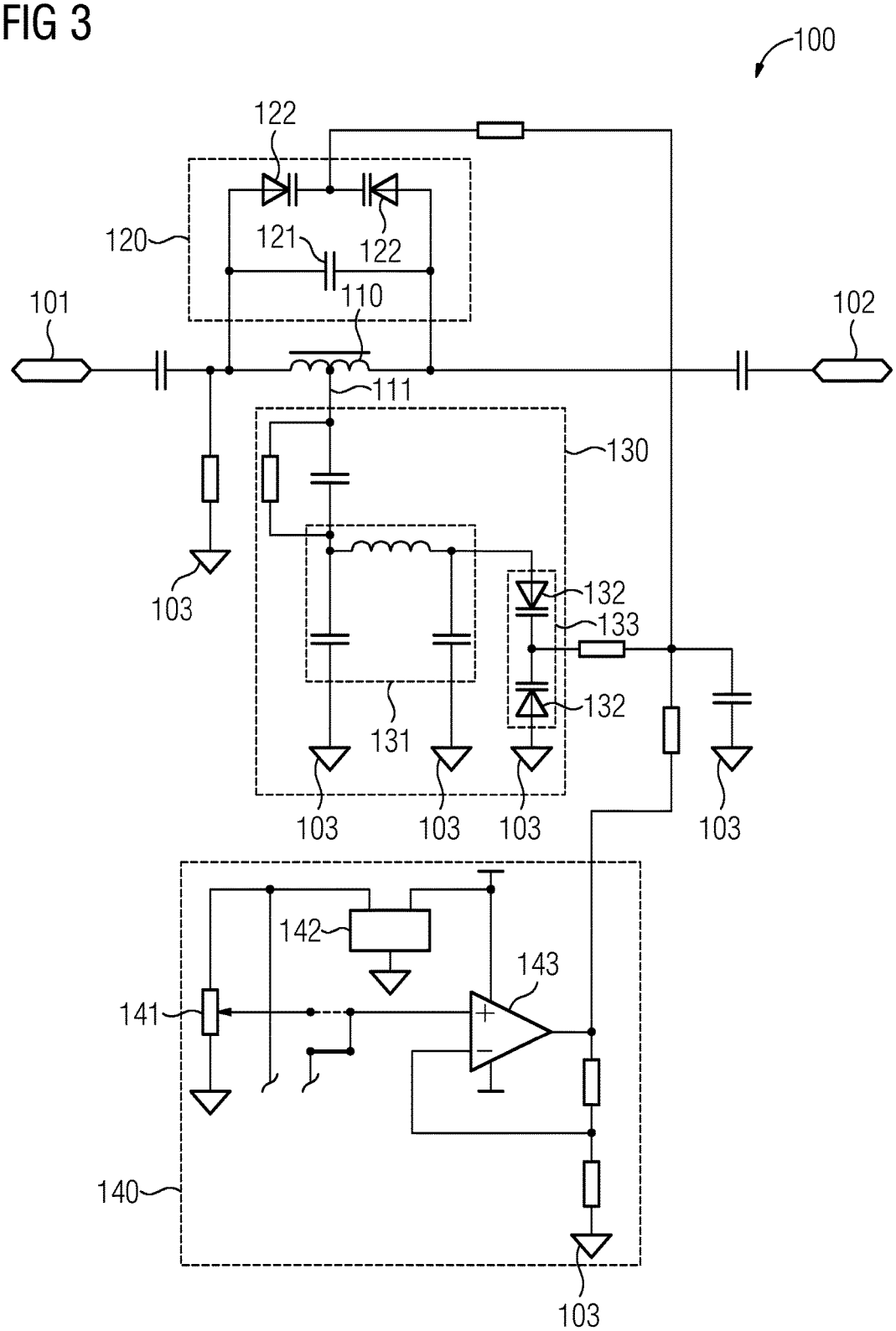

CONTINUOUSLY DIGITALLY ADJUSTABLE PHASE ACTUATOR

This application claims the benefit of DE 10 2017 214 180.8, filed on Aug. 15, 2017, which is hereby incorporated by reference in its entirety.

BACKGROUND

The present embodiments relate to a continuously digitally adjustable phase actuator for radio-frequency applications.

Magnetic resonance tomographs are imaging devices that, for imaging an examination object, align nuclear spins of the examination object with a strong external magnetic field and through a magnetic alternating field excite the nuclear spins into precession around this alignment. The precession or return of the spins from this excited state into a state with lower energy creates a magnetic alternating field as a response, which is received via antennas.

With the aid of magnetic gradient fields, a spatial encoding is impressed on the signals, which subsequently makes an assignment of the received signal to a volume element possible. The received signal is then evaluated, and a three-dimensional imaging representation of the examination object is provided. Local antennas (e.g., local coils) may be used for receiving the signal. The local antennas are arranged directly on the examination object for achieving a better signal-to-noise ratio.

The spins are excited by a magnetic alternating field created by a power amplifier and irradiated into the examination region by an antenna. In this process, powers of several Kilowatts are usual. The power is partly created via a number of separate power amplifiers. Signals of the separate power amplifiers are to have a precisely defined phase relationship. The individual antennas are also controlled in an antenna matrix, for example, with precisely defined phase displacements relative to one another, in order to achieve a predefined spatial field distribution of the excitation field.

In such cases, an individual control signal may be created digitally separately for each individual antenna output, but this requires a considerable outlay in circuit technology and signal processing resources, however.

Obtaining different control signals from a single input signal by phase displacement may also be provided. This is achieved by a control of variable phase actuators, usually by connectable discrete phase shifters with a fixed value. As the increment of the phase displacement to be achieved decreases, however, the number of discrete phase shifters increases, and thus, the circuit outlay increases significantly.

SUMMARY AND DESCRIPTION

The scope of the present invention is defined solely by the appended claims and is not affected to any degree by the statements within this summary.

The present embodiments may obviate one or more of the drawbacks or limitations in the related art. For example, an improved adjustable phase actuator is provided at low cost.

One embodiment of a phase actuator for a continuously adjustable phase displacement at a first frequency includes a signal input, a signal output, a reference mass, a first inductance with tapping point, a first continuously variable capacitance, and a transformation network. An inductance with tapping point in the sense of one or more of the present embodiments has two sub-inductances that are magnetically coupled to one another (e.g., by a common ferrite core or an arrangement in which the magnetic fields induced by windings of the one sub-inductance penetrate the surface surrounded by a winding of the second sub-inductance). This may involve a coil, for example, in which, along with the terminal connections, a tapping-off point on a winding is taken off in between them. In one embodiment, two coils that are arranged coaxially immediately adjacent to one another or on a common ferrite core are provided. The neighboring terminal connections of the two coils are connected electrically to one another.

A variable capacitance in the sense of one or more of the present embodiments may have a capacitance value varied by an electrical signal. In one embodiment, such capacitors involve capacitance diodes, but rotary capacitors with actuators or other electrically variable capacitors may also be provided.

The signal input and the signal output are connected by the first inductance. The first continuously variable capacitance is connected in parallel to the first inductance, so that the inductance and the first continuously variable capacitance form a parallel resonant circuit. Further components (e.g., capacitances and inductances with fixed values) may be provided in the parallel resonant circuit in one or more of the present embodiments. For example, a constant capacitance may be connected in parallel to the variable capacitance in order to achieve higher capacitance values.

The tapping point of the inductance is connected to a transformation network. Transformation network may be a circuit that maps a complex impedance at a second terminal of the transformation network to another, different complex impedance at a first terminal of the transformation network. In this way, complex resistances, for which there is no real implementation as a single component such as inductance, capacitance, or Ohmic resistance, may be represented. In one embodiment of a phase shifter, the behavior of the transformation network corresponds to a quarter wave line (e.g., Lambda Quarter Line). Lambda may be the wavelength of a signal on a conductor of the quarter wave line, of which the frequency is a prespecified working frequency of the phase actuator (e.g., the first frequency; in other words, for which the continuously variable phase displacement is to be achieved). The impedance of the transformation network connected to the tapping point of the first inductance in this case corresponds to the impedance of a quarter wave line, to the second terminal of which a second capacitance with the capacitance value of the first capacitance is connected. In this case, "to correspond" may be a deviation of the impedance values (e.g., quadratic deviation of the real and imaginary part) of less than 1%, 5%, or 10%.

In one embodiment of the phase actuator, the tapping point of the inductance is a center tapping point. A center tapping point may be a tapping point that is arranged electrically symmetrically to the end terminals of the inductance. The inductance may be an air coil or a coil on a ferrite core with 2N windings, where the tapping point establishes an electrical connection to the Nth winding.

A symmetry between signal input and signal output of the phase actuator is achieved by a center tapping point, so that the impedance at the signal input and at the signal output is the same.

In one embodiment of the phase actuator, the first capacitance has a capacitance diode.

A capacitance diode makes possible a rapid adjustment of the capacitance with a low space requirement without mechanical moving parts.

In one embodiment of the phase actuator, the first capacitance has two capacitance diodes connected antiparallel in series.

Two capacitance diodes connected antiparallel in series allow in a simple way a decoupled supply of a DC voltage for setting the capacitance diodes, since a DC voltage supplied with suitable polarity to a common terminal of the capacitance diodes connected electrically conductively in both directions blocks the antiparallel connected capacitance diodes. In this way, only a negligible DC current flows, which does not require any appreciable control power.

In one embodiment of the phase actuator, the transformation network has a Collins filter and a second capacitance. A Collins filter or PI element, for example, having an inductance connected between filter input and filter output and also two filter capacitances, connected in each case between filter input and reference mass and filter output and reference mass, is an option for emulating the transformation behavior of a quarter wave line and of providing at the filter input or the first terminal the quarter wave transform to the second capacitance, which is connected at the filter output or second terminal to the reference mass.

A Collins filter is a compact alternative that emulates the electrical behavior of a quarter wave line in a space-saving manner even for wavelengths in the decimeter and meter range.

In one embodiment of the phase actuator, the phase actuator is configured to set the first capacitance and the second capacitance to a capacitance value that is essentially the same. Essentially the same may be a deviation between the capacitances of less than 1%, 5%, or 10%.

Setting the same capacitance values (e.g., when using the same capacitance diodes) is a simple way of insuring the same behavior of the first capacitance and second capacitance as a function of the control voltage. In this way, it is provided that via the transformation network, the capacitances compensate for each other in relation to the amplitude, and only the phase is changed by the phase actuator.

In one embodiment of the phase actuator, the second capacitance has two capacitance diodes connected antiparallel in series. In this case, the same advantages already described for the first capacitance also apply for the second capacitance.

In one embodiment of the phase actuator, the phase actuator has a power supply configured to control the capacitance diodes of the first capacitance and the capacitance diodes of the second capacitance with the same voltage.

The capacitance diodes used for the first capacitance and the second capacitance are of the same type and are both connected to a common control voltage supply, so that the same voltage is present at the capacitance diodes of the first capacitance and of the second capacitance. This enables it to be provided in a simple way that the capacitances in both branches of the phase actuator behave in the same way. In one embodiment, different capacitance diodes may be used, and a correspondingly scaled voltage (e.g., from a voltage divider) may be applied as a function of an output voltage provided by the control power supply to one of the two capacitances.

The magnetic resonance tomograph with one embodiment of the phase actuator shares the advantages of the phase actuator.

BRIEF DESCRIPTION OF THE DRAWINGS

FIG. 3 shows a typical circuit layout for one embodiment of a phase actuator.

DETAILED DESCRIPTION

Figure 1:
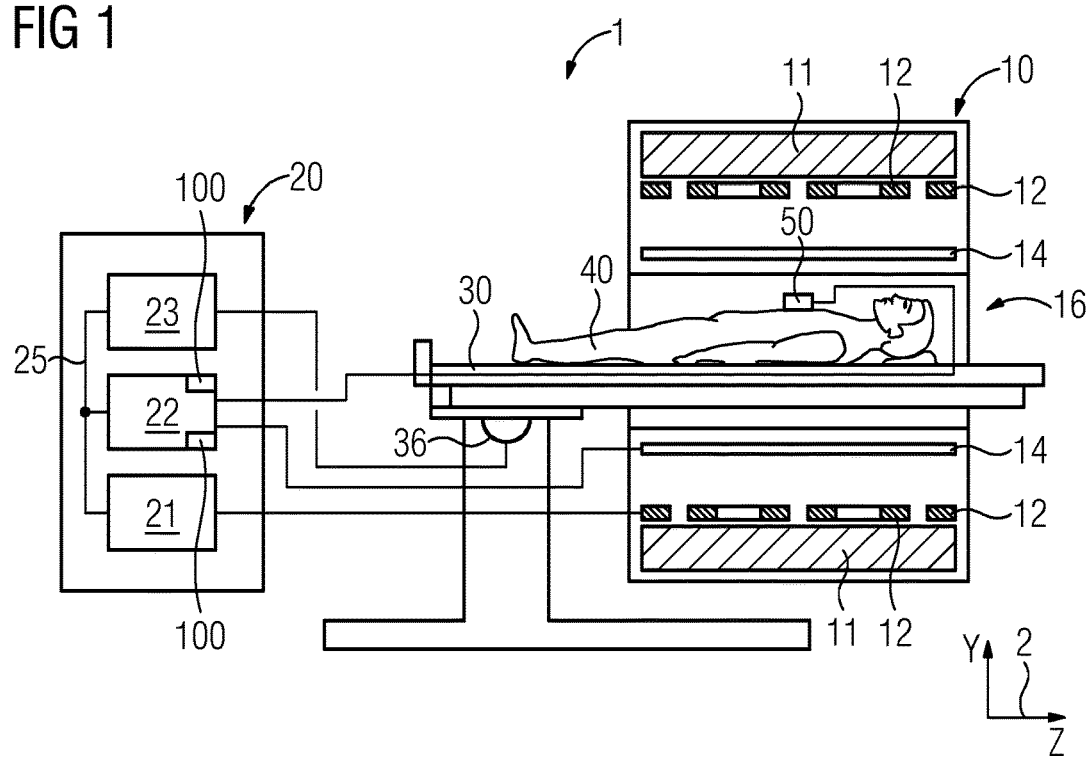
FIG. 1 shows a schematic diagram of a magnetic resonance tomograph with one embodiment of a phase actuator.

FIG. 1 shows a schematic diagram of a magnetic resonance tomograph 1 with one embodiment of a phase actuator.

The magnet unit 10 has a field magnet 11 that creates a static magnetic field BO to align the nuclear spin of samples or patients 40 in a recording region. The recording region is arranged in a patient tunnel 16 that extends in a longitudinal direction 2 through the magnet unit 10. A patient couch 30 is able to be moved by the drive unit 36 in the patient tunnel 16. The field magnet 11 may involve a superconducting magnet that may provide magnetic fields with a magnetic flux density of up to 3T, with the latest devices even more than 3T. For lower field strengths, however, permanent magnets or electromagnets with normally-conducting coils may be employed.

The magnet unit 10 also has gradient coils 12 that are configured, for spatial differentiation of the imaging regions in the examination volume acquired, to superimpose variable magnetic fields on the magnetic field B0 in three spatial directions. The gradient coils 12 may be coils made of normally-conducting wires that may create fields orthogonal to one another in the examination volume.

The magnet unit 10 likewise has a body coil 14 that is configured to irradiate a radio-frequency signal supplied via a signal line into the examination volume and to receive resonant signals emitted from the patient 40 and output the resonant signals via a signal line.

A control unit 20 (e.g., a controller) supplies the magnet unit 10 with the various signals for the gradient coils 12 and the body coil 14 and evaluates the received signals.

Thus, the control unit 20 has a gradient controller 21 configured to supply the gradient coils 12 via supply lines with variable currents, which provide the desired fields temporally coordinated in the examination volume.

The control unit 20 also has a radio-frequency unit 22 configured to create a radio-frequency pulse with a predetermined timing curve, amplitude, and spectral power distribution for exciting a magnetic resonance of the nuclear spin in the patient 40. In such cases, pulse powers in the Kilowatt range may be reached. The excitation pulses may also be irradiated into the patient 40 via the body coil 14 or also via a local transmit antenna.

In order to achieve a homogeneous excitation of the nuclear spin on transmission of the excitation pulses or also to achieve a selective sensitivity on receipt, antennas such as the body coil 14 or the local coil 50 have individually controllable segments. By a suitable combination of signals with different phase displacements, a desired directional effect may be achieved in such cases. Phase actuators 100 of one or more of the present embodiments may be provided in the receive and/or transmit path in the radio-frequency unit 22.

Figure 2:
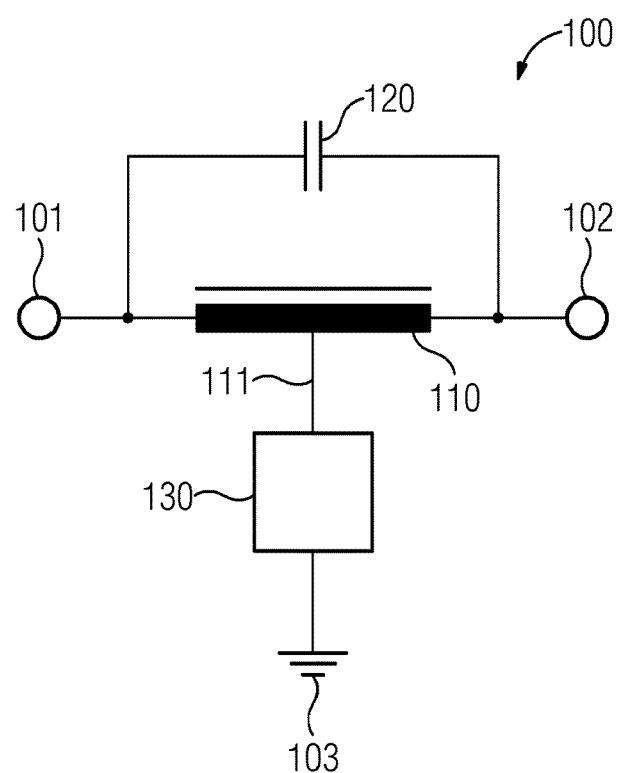
FIG. 2 shows a diagram of function blocks of one embodiment of a phase actuator.

Shown in FIG. 2 are the major functional blocks of a phase actuator 100 of one or more of the present embodiments. The phase actuator 100 has a signal input 101, at which an input signal is supplied to the phase actuator 100 with reference to the reference mass 103, of which the phase is to be changed. The phase-shifted output signal, which is likewise to be output with reference to the reference mass 103 then lies at a signal output 102.

Arranged between signal input 101 and signal output 102 is a parallel resonant circuit, made up of the inductance 110 and the first capacitance 120. However further capacitances or other components, with which the resonant frequency of the parallel resonant circuit may be displaced (e.g., a parallel capacitance to the variable first capacitance 120) may also be provided. The parallel resonant circuit may, however, as well as a phase displacement of the input signal dependent on the capacitance 120, also lead to a change in amplitude with a frequency f0, since the resonant frequency of the parallel resonant circuit also changes with the capacitance and thus the amplitude at a fixed frequency.

In order to compensate for this effect, a transformation network 130 is arranged at a tapping point 111 of the inductance 110, via which the tapping point 111 is connected to the reference mass 103. When the phase actuator 100 is to be transparent in relation to the amplitude, and signal input 101 and signal output 102 are to have the same surge impedance, the phase actuator is symmetrical to signal input 101 and signal output 102. This provides that the tapping point 111 of the inductance 110 is also to be symmetrical (e.g., the tapping point 111 is a central tapping point of the inductance 110), so that with a coil as inductance, precisely as many windings are located are between signal input 101 and tapping point 111 as between tapping point 111 and signal output 102, provided the geometry is otherwise unchanged on both sides. If however, as well as a phase displacement, an impedance matching by the phase actuator 100 is also desired, the tapping point 111 may also be arranged asymmetrically. Equivalent to a tapping point 11 are also two inductances connected in series with a common core or corresponding coaxial alignment as a common long coil without core.

With an impedance $Z_0$ at signal input 101 and at signal output 102, the complex resistance X1 of the first capacitance 120 and the complex resistance X2 of the inductance 110, for a pure phase displacement without change in amplitude, the following condition is produced:

$$X1*X2+Z_0^2=0$$

With $X1=-1/(\omega C)$ and $X2=\omega L$, the following condition is produced $$L=C*Z_0^2$$

While C may be embodied, for example, by a capacitance diode as a variable, electrically adjustable capacitance, it is, however, significantly more problematic to provide a simple, electrically adjustable inductance.

The inductance is replaced by an easily adjustable capacitance such as, for example, a capacitance diode. In accordance with one or more of the present embodiments, this is realized by a transformation of the complex resistance that maps the inductance to a capacitance and vice versa. This may be achieved, for example, by a quarter wave line (e.g., Lambda Quarter Line). In this case, Lambda is the wavelength of an electromagnetic wave with the frequency f=ω/(2π) on the line. If the capacitance (e.g., a capacitance diode) is connected to the end of the quarter wave line, then the line behaves at the other end, with a surge impedance $Z_0$ connected, like the required inductance.

Typical frequency ranges for magnetic resonance tomographs are today between 20 MHz and 150 MHz, which corresponds to wavelengths 15 m and 2 m in a vacuum. Even with a shortening by a dielectric quarter wave, lines would thus be too unwieldy for the usual circuit technologies.

FIG. 3 shows an example of a realization of a phase actuator. The same objects are labeled with the same reference numbers as in FIG. 2.

The first capacitance, in the form of embodiment of FIG. 3, is represented by a fixed capacitance 121, and two capacitance diodes 122 (e.g., type KV1560) are connected antiparallel. The capacitance diodes together provide a series capacitance able to be controlled by a voltage, which is connected in parallel to the fixed capacitance 121. The antiparallel capacitance diodes 122 obtain a control voltage from a control voltage generator 140 via a common connection point, which may be embodied by an adjustable resistance 141 that may be embodied as a DA converter, and is provided to a voltage controller 142 and an operational amplifier 143. The two capacitance diodes 122 are connected at anodes via a resistance or additionally the inductance 110 to the reference mass, so that a positive control voltage from the control voltage generator 140 pre-powers the capacitance diodes 122 in the blocking direction.

The transformation network 130 is provided by a PI or Collins filter 131 instead of the space-consuming quarter wave line, which together with an upstream capacitor, represents the adjustable second capacitance 133 behind the Collins filter as a variable inductance at the tapping point 111 before the Collins filter provided by the two capacitance diodes 132. At 10 MHz and a rated impedance of 50 Ohm, the two capacitors of the PI filter have a capacitance of 318 pF, and the inductance may have a value of 796 nH.

The two capacitance diodes 132 are supplied in the same way already described by the control voltage generator 140 with an adjustable voltage for changing the capacitance. A symmetrical behavior of the first capacitance 120 and of the transformation network 130 over the entire adjustment range is provided by the same voltage and identical capacitance diodes 122, 132.

Although the invention has been illustrated and described in greater detail by the exemplary embodiments, the invention is not restricted by the disclosed examples. Other variations may be derived herefrom without departing from the scope of protection of the invention.

The elements and features recited in the appended claims may be combined in different ways to produce new claims that likewise fall within the scope of the present invention. Thus, whereas the dependent claims appended below depend from only a single independent or dependent claim, it is to be understood that these dependent claims may, alternatively, be made to depend in the alternative from any preceding or following claim, whether independent or dependent. Such new combinations are to be understood as forming a part of the present specification.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A phase actuator for a continuously adjustable phase displacement at a first frequency, the phase actuator comprising:
    a signal input;
    a signal output;
    a reference mass; a first inductance with a tapping point;
    a first continuously variable capacitance; and
    a transformation network, wherein the signal input and the signal output are electrically connected by the first inductance, wherein the first continuously adjustable capacitor is connected in parallel to the first inductance, wherein the tapping point is connected via a transformation network to the reference mass, and wherein an impedance value of the transformation network corresponds to a quarter wave transform of a capacitance value of the first continuously variable capacitance at the first frequency.

2. The phase actuator of claim 1, wherein the tapping point of the inductance is a central tapping point.

3. The phase actuator of claim 1, wherein the first continuously variable capacitance has a capacitance diode.

4. The phase actuator of claim 3, wherein the capacitance diode is a first capacitance diode, and wherein the first continuously variable capacitance has a second capacitance diode, the first capacitance diode and the second capacitance diode being connected antiparallel in series.

5. The phase actuator of claim 4, wherein the transformation network has a Collins filter and a second variable capacitance.

6. The phase actuator of claim 5, wherein the phase actuator is configured to set the first continuously variable capacitance and the second variable capacitance to a capacitance value that is essentially the same.

7. The phase actuator of claim 5, wherein the second variable capacitance has two capacitance diodes connected antiparallel in series.

8. The phase actuator of claim 7, further comprising a control voltage generator configured to control the first capacitance diode and the second capacitance diode of the first continuously variable capacitance and the two capacitance diodes of the second variable capacitance with a same voltage.

9. A magnetic resonance tomograph comprising:
a phase actuator for a continuously adjustable phase displacement at a first frequency, the phase actuator comprising:
a signal input;
a signal output;
a reference mass; a first inductance with a tapping point;
a first continuously variable capacitance; and
a transformation network, wherein the signal input and the signal output are electrically connected by the first inductance, wherein the first continuously adjustable capacitor is connected in parallel to the first inductance, wherein the tapping point is connected via a transformation network to the reference mass, and wherein an impedance value of the transformation network corresponds to a quarter wave transform of a capacitance value of the first continuously variable capacitance at the first frequency.

10. The magnetic resonance tomograph of claim 9, wherein the tapping point of the inductance is a central tapping point.

11. The magnetic resonance tomograph of claim 9, wherein the first continuously variable capacitance has a capacitance diode.

12. The magnetic resonance tomograph of claim 11, wherein the capacitance diode is a first capacitance diode, and wherein the first continuously variable capacitance has a second capacitance diode, the first capacitance diode and the second capacitance diode being connected antiparallel in series.

13. The magnetic resonance tomograph of claim 12, wherein the transformation network has a Collins filter and a second variable capacitance.

14. The magnetic resonance tomograph of claim 13, wherein the phase actuator is configured to set the first continuously variable capacitance and the second variable capacitance to a capacitance value that is essentially the same.

15. The magnetic resonance tomograph of claim 13, wherein the second variable capacitance has two capacitance diodes connected antiparallel in series.

16. The magnetic resonance tomograph of claim 15, further comprising a control voltage generator configured to control the first capacitance diode and the second capacitance diode of the first continuously variable capacitance and the two capacitance diodes of the second variable capacitance with a same voltage.

* * * * *